United States Patent
Liu et al.

(10) Patent No.: US 9,076,854 B2
(45) Date of Patent: Jul. 7, 2015

(54) SEMICONDUCTOR DEVICE

(71) Applicant: TAIWAN SEMICONDUCTOR MANUFACTURING COMPANY, LTD., Hsinchu (TW)

(72) Inventors: Po-Chun Liu, Hsinchu (TW); Chi-Ming Chen, Zhubei (TW); Chen-Hao Chiang, Jhongli (TW); Chung-Yi Yu, Hsinchu (TW); Chia-Shiung Tsai, Hsinchu (TW); Xiaomeng Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/010,309

(22) Filed: Aug. 26, 2013

(65) Prior Publication Data

US 2015/0053992 A1      Feb. 26, 2015

(51) Int. Cl.
| | | |
|---|---|---|
| *H01L 31/072* | (2012.01) | |
| *H01L 29/778* | (2006.01) | |
| *H01L 29/205* | (2006.01) | |
| *H01L 29/20* | (2006.01) | |
| *H01L 29/66* | (2006.01) | |

(52) U.S. Cl.
CPC .......... *H01L 29/7786* (2013.01); *H01L 29/205* (2013.01); *H01L 29/2003* (2013.01); *H01L 29/66431* (2013.01)

(58) Field of Classification Search
CPC ............ H01L 29/2003; H01L 29/7787; H01L 29/66462; H01L 29/7783; H01L 29/42316
USPC ........... 257/290, 194, E29.248, E29.249, 190
See application file for complete search history.

(56) References Cited

U.S. PATENT DOCUMENTS

| | | | |
|---|---|---|---|
| 7,608,532 B2* | 10/2009 | Lin et al. ...................... | 438/602 |
| 2013/0313612 A1* | 11/2013 | Khalil et al. ................. | 257/194 |

OTHER PUBLICATIONS

Heikman, S., et al., "Polarization Effects in AlGaN/GaN and GaN/AlGaN Heterostructures", Peer Reviewed; eScholarship, University of California, Journal of Applied Physics, vol. 93, No. 12, Jun. 15, 2003; pp. 10114-10118.

Fujii, Takahiro et al., "High on/Off Ratio in Enhancement-Mode AlxGa1-xN/GaN Junction Heterostructure Field-Effect Transistors with P-Type GaN Gate Contact", Japanese Journal of Applied Physics, vol. 45, No. 39, 2006, pp. L1048-L1050.

* cited by examiner

*Primary Examiner* — Quoc Hoang
(74) *Attorney, Agent, or Firm* — Lowe Hauptman & Ham, LLP

(57) ABSTRACT

A semiconductor device includes a substrate, a channel layer over the substrate, an active layer over the channel layer, a gate structure over the active layer, and a barrier layer between the gate structure and the active layer. The active layer is configured to cause a two dimensional electron gas (2DEG) to be formed in the channel layer along an interface between the channel layer and the active layer. The gate structure is configured to deplete the 2DEG under the gate structure. The gate structure includes a dopant. The barrier layer is configured to block diffusion of the dopant from the gate structure into the active layer.

20 Claims, 7 Drawing Sheets

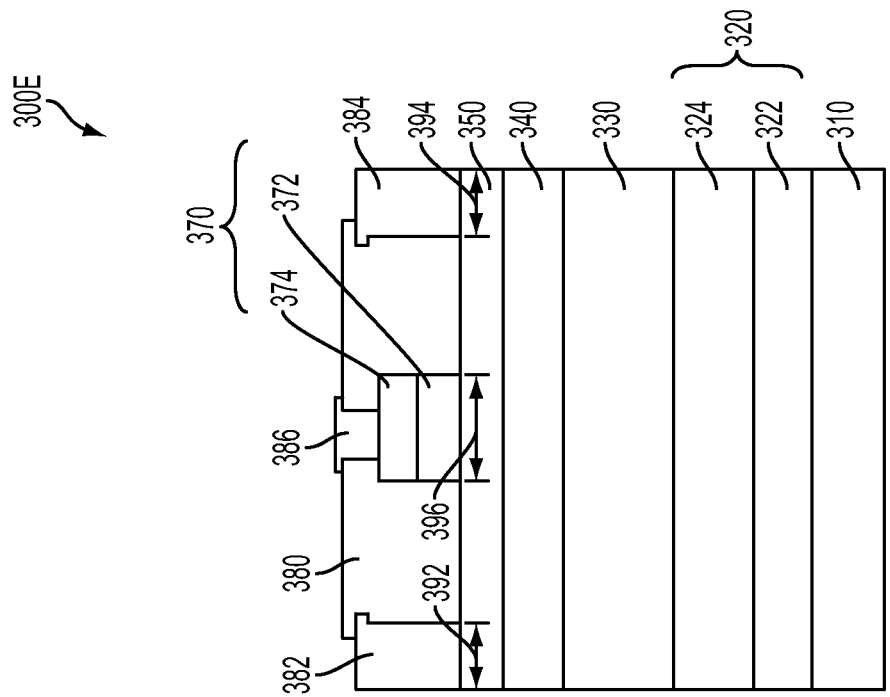
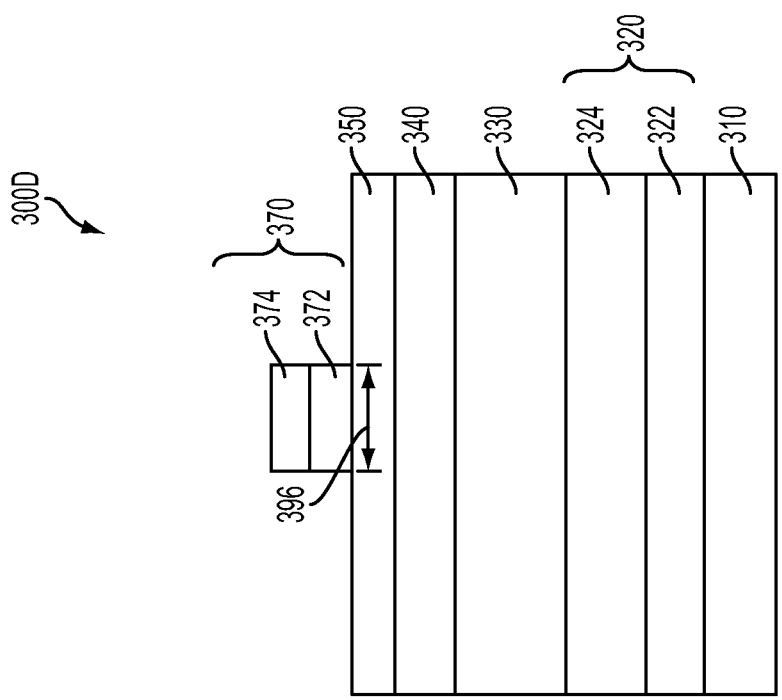
FIG. 3E
FIG. 3D

US 9,076,854 B2

SEMICONDUCTOR DEVICE

BACKGROUND

Due to high current density, high breakdown voltage, and low ON resistance, High Electron Mobility Transistors (HEMTs) are suitable for use in power applications. An HEMT structure includes a channel layer and an active layer. A two-dimensional electron gas (2DEG) is generated in the channel layer, adjacent an interface with the active layer. The 2DEG is used in the HEMT structure as charge carriers. The 2DEG is generated even in the absence of a voltage applied to the HEMT structure. Thus, an HEMT structure is, by nature, a normally ON structure with a negative threshold voltage. A consideration in designing circuitry for power applications involves converting a normally ON HEMT structure to a normally OFF HEMT structure with a positive threshold voltage.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 3A-3E are schematic cross-sectional views of a semiconductor device at various stages during manufacture in accordance with some embodiments.

DETAILED DESCRIPTION

Figure 1:
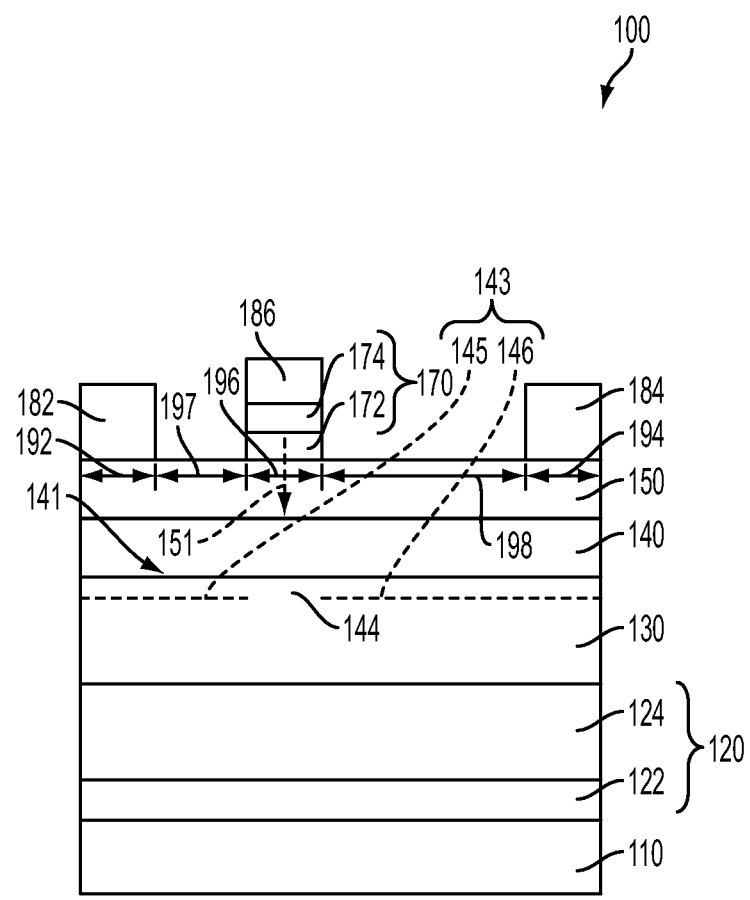
FIG. 1 is a schematic cross-sectional view of a semiconductor device in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

In order to convert a normally ON HEMT structure to a normally OFF HEMT structure, a gate structure over the active layer is configured to deplete the 2DEG under the gate structure. In some situations, a dopant in the gate structure is diffused into the active layer and causes potential negative impacts on the 2DEG. In some embodiments, a barrier layer is formed between the gate structure and the active layer to block diffusion of the dopant from the gate structure into the active layer. As a result, potential negative impacts of the dopant diffusion on the 2DEG are avoidable or, at least, reduced. In at least one embodiment, the bather layer is configured to further deplete the 2DEG under the gate structure and partially deplete the 2DEG in a region surrounding the gate structure. As a result, a channel resistivity of the HEMT structure in an OFF state is increased and an OFF current of the HEMT structure is reduced. In at least one embodiment, the barrier layer is partially removed in a region surrounding the gate structure. As a result, the 2DEG in the region surrounding the gate structure is not depleted as strongly as under the gate structure, and an ON current of the HEMT structure is increased. The HEMT structure in accordance with some embodiments has a reduced OFF current and an increased ON current, resulting in an advantageously high ON/OFF current ratio (also referred to as "on-off ratio"). The described structure and/or method is/are suitable not only for HEMT structures, but also for other types of semiconductor devices which use 2DEGs as charge carriers.

FIG. 1 is a schematic cross-sectional view of a semiconductor device 100 in accordance with some embodiments. The semiconductor device 100 comprises a substrate 110, a buffer layer 120 over the substrate 110, a channel layer 130 over the buffer layer 120, an active layer 140 over the channel layer 130, and a barrier layer 150 over the active layer 140. The semiconductor device 100 further comprises a gate structure 170 over the barrier layer 150 and having a p-doped layer 172 and an n-doped layer 174. The semiconductor device 100 also comprises a source electrode 182 and a drain electrode 184 over the barrier layer 150, and a gate electrode 186 over the gate structure 170. In some embodiments, the source electrode 172 and the drain electrode 174 are formed over the active layer 140 or the channel layer 130.

In some embodiments, the substrate 110 includes a silicon carbide (SiC) substrate, sapphire substrate, or a silicon substrate. In at least one embodiment, the substrate 110 includes a Si(111) wafer to provide an optimal lattice mismatch with an overlying layer, such as a GaN layer described herein.

In some embodiments, the buffer layer 120 includes a nucleation layer 122 over the substrate 110. The nucleation layer 122 has a lattice structure and/or a thermal expansion coefficient (TEC) suitable for bridging the lattice mismatch and/or the TEC mismatch between the substrate 110 and an overlying layer, such as the channel layer 130. In some embodiments, the nucleation layer 122 includes aluminum nitride (AlN). In some embodiments, the nucleation layer 122 has a thickness of 70 to 300 nanometers (nm). In some embodiments, the nucleation layer 122 is omitted.

In some embodiments, the buffer layer 120 includes a transition layer 124 over the nucleation layer 122, or over the substrate 110 in one or more embodiments where the nucleation layer 122 is omitted. The transition layer 124 further facilitates gradual changes of lattice structures and TECs between the nucleation layer 122 (or the substrate 110) and the channel layer 130. In some embodiments, the transition layer 124 includes a graded aluminum-gallium nitride ($Al_xGa_{(1-x)}N$, x is the aluminum content ratio in the aluminum-gallium constituent, $0<x<1$) layer. In some embodiments, the graded aluminum gallium nitride layer includes multiple layers each having a decreased ratio x (from a bottom layer adjoining the nucleation layer to a top layer adjoining the channel layer 130). In at least one embodiment, the graded aluminum gallium nitride layer has three layers having the x ratio in the range of 0.7-0.9 for the bottom layer, in the range of 0.4-0.6 for a middle layer, and in the range of 0.15-0.3 for the top layer. In some embodiments, instead of having multiple layers with different x ratios, the graded aluminum gallium nitride layer has a continuous gradient of the ratio x. In some embodiments, the transition layer 124 has a thickness of 500 to 1050 nm. In some embodiments, the transition layer 124 is omitted.

In some embodiments, the channel layer 130 includes one or more Group III-V compound layers. One or more of the Group III-V compound layers is doped in at least one embodiment. In one or more embodiments, the channel layer 130 includes alternatingly arranged p-doped and n-doped Group III-V compound layers. In at least one embodiment, the channel layer 130 includes a C-doped GaN layer. In some embodiments, the channel layer 130 has a thickness of 500 to 5000 nm.

The active layer 140 includes one or more Group III-V compound layers which are different from the Group III-V compound layers of the channel layer 130 in composition. In some embodiments, the active layer 140 comprises AlN, $Al_yGa_{(1-y)}N$ (where y is the aluminum content ratio, 0<y<1), or a combination thereof. In at least one embodiment, y is 10 to 30% and/or the thickness of the active layer 140 is 10 to 30 nm. The active layer 140 is configured to cause a 2DEG to be formed in the channel layer 130 along an interface 141 between the channel layer 130 and the active layer 140. A heterojunction is formed between the active layer 140 and the channel layer 130 having two different semiconductor materials. A band gap discontinuity exists between the active layer 140 and the channel layer 130. The electrons from a piezoelectric effect in the active layer 140 drop into the channel layer 130, and thus create a thin layer 143 of highly mobile conducting electrons, i.e., the 2DEG, in the channel layer 130, adjacent the interface 141 with the active layer 140. The electrons in the 2DEG are charge carriers in the channel layer 130. In some embodiments, when a sufficient is applied to the gate electrode 186, it is possible to modulate a current (i.e., a drain current) flowing through the channel layer 130, from the drain electrode 184 to the source electrode 182.

The 2DEG is generated naturally at the interface 141 of different Group III-V compound materials forming the heterojunction between the channel layer 130 and the active layer 140. Due to the naturally occurring 2DEG and without the gate structure 170, the semiconductor device 100 would be conductive without the application of a voltage to the gate electrode 186, i.e., the semiconductor device 100 would be a normally ON device with a negative threshold voltage. Such a normally ON state is a design concern in power applications where it is desirable to prevent, or substantially inhibit, current from flowing in or through the HEMT structure before the circuitry is powered, for example, to reduce power consumption and/or avoid start-up issues.

In some embodiments, to convert a normally ON HEMT structure to a normally OFF HEMT structure, a gate structure over the active layer is configured to deplete the 2DEG under the gate structure. For example, the gate structure 170 over the active layer 140 is configured to deplete the 2DEG under the gate structure 170, i.e., the 2DEG is depleted in an area 144 under the gate structure 170, leaving the 2DEG in areas 145, 146, between (i) the gate structure 170 and (ii) the source electrode 182 and the drain electrode 184, respectively. The gate structure 170 includes the p-doped layer 172 over the active layer 140, and the n-doped layer 174 over the p-doped layer 172. Example materials for the p-doped layer 172 and/ or the n-doped layer 174 include, but are not limited to, GaN, AlGaN, InGaN and InAlGaN. Examples of p-type dopants include, but are not limited to, carbon, iron, magnesium, and zinc. Examples of n-type dopants include, but are not limited to, silicon and oxygen. In at least one embodiment, the n-doped layer 174 is omitted.

The p-doped layer 172, e.g., p-doped GaN or p-GaN, and the active layer 140, e.g., $Al_yGa_{(1-y)}N$, together form a PN junction over the area 144. Such a PN junction depletes the 2DEG in the area 144 under the gate structure 170, when no voltage is applied to the semiconductor device 100. In at least one embodiment where the n-doped layer 174 is provided, the n-doped layer 174, e.g., n-doped GaN or n-GaN, defines together with the p-doped layer 172 and the active layer 140, an NPN junction which also depletes the 2DEG in the area 144 under the gate structure 170. The n-doped layer 174 is further configured as a contact layer between the p-doped layer 172 and the gate electrode 186. Because the PN or NPN junction depletes the 2DEG in the area 144 under the gate structure 170, the 2DEG is interrupted in the area 144 and current is no longer flowing in the semiconductor device 100 when no voltage is applied to the semiconductor device 100. The semiconductor device 100 with the gate structure 170 is a normally OFF HEMT structure, which has a positive threshold voltage.

The barrier layer 150 is between the active layer 140 and the gate structure 170 and is configured to block diffusion of a dopant in the gate structure 170 into the active layer 140. Specifically, without the barrier layer 150, the p-type dopant, e.g., Mg, in the p-doped layer 172 of the gate structure 170 has a tendency to diffuse into the active layer 140 (or even into the 130), as shown by arrow 151. The Mg atoms diffused into the active layer 140 and/or the channel layer 130 potentially cause negative impacts on one or more characteristics of the 2DEG. For example, the electron mobility in the 2DEG is potentially reduced due to the Mg diffusion into the active layer 140 and/or the channel layer 130. By forming the barrier layer 150 between the gate structure 170 and the active layer 140, a diffusion barrier to the dopant, e.g., Mg, of the gate structure 170 is provided. As a result, potential negative impacts of the dopant diffusion on the characteristics of the 2DEG are avoidable or, at least, reduced.

In some embodiments, the barrier layer 150 comprises a Group III-V compound. Examples of Group III-V compounds include, but are not limited to, GaN, AlGaN, InGaN and InAlGaN. In at least one embodiment, the barrier layer 150 is undoped. As used herein, a "undoped" layer is a layer that is not doped, or that is unintentionally doped, with a dopant. It is possible that an undoped layer is unintentionally doped during the formation of other layers. For example, it is possible that the barrier layer 150, which is not doped during the formation thereof, is nevertheless unintentionally doped with a dopant of the p-doped layer 172 during the formation of the p-doped layer 172 over the barrier layer 150. Such a unintentionally doped barrier layer 150 is still considered an undoped layer in this disclosure. In at least one embodiment, the barrier layer 150 includes undoped GaN (or i-GaN). In at least one embodiment, the barrier layer 150 includes undoped InGaN (i-InGaN) in which the content of In is 5 to 15%. In at least one embodiment, the barrier layer 150 has a higher lattice constant than a lattice constant of the active layer 140. In at least one embodiment, a thickness of the barrier layer 150 is 2 to 5 nm. In some situations, a thickness of the barrier layer 150 less than 2 nm is insufficient to effectively block diffusion of the dopant from the gate structure 170 into the active layer 140. In some situations, a thickness of the barrier layer 150 greater than 5 nm is unnecessarily thick for dopant diffusion blocking, material is wasted and production costs increase.

In some embodiments, the barrier layer 150 is configured to further deplete the 2DEG under the gate structure 170 and partially deplete the 2DEG in a region surrounding the gate structure 170. For example, in at least one embodiment where the barrier layer 150 made of an undoped Group III-V compound, such as i-GaN or i-InGaN, is formed over the $Al_yGa_{(1-y)}N$/GaN stack of the active layer 140 and the channel layer 130, the electric field in the active layer 140 is increased, causing a decrease in the electron density of the 2DEG. Under the gate structure 170 where the 2DEG is depleted by the gate structure 170, the increased electric field caused by the barrier layer 150 in the active layer 140 provides a further depletion effect. As a result, a threshold voltage for turning ON the semiconductor device 100 becomes higher than in a semiconductor device without the barrier layer 150. The higher threshold voltage renders the semiconductor device 100 suitable for use in various applications, especially power applications, in accordance with some embodiments.

In the region surrounding the gate structure 170, the partial depletion effect provided by the barrier layer 150 contributes to improvements of parasitic resistance and/or current characteristics of the semiconductor device 100. Specifically, as discussed herein, the 2DEG is generated naturally at the interface 141 between the channel layer 130 and the active layer 140, except in the gate region 196 under the gate structure 170 where the 2DEG is depleted. Even when no voltage is applied to the semiconductor device 100, i.e., in the OFF state, the 2DEG is naturally generated in the area 145 corresponding to a source region 192 and a source-to-gate region 197, and in the area 146 corresponding to a drain region 194 and a drain-to-gate region 198. The source-to-gate region 197 is between the source region 192 under the source electrode 182 and a gate region 196 under the gate structure 170. The drain-to-gate region 198 is between the drain region 194 under the drain electrode 184 and the gate region 196. In some situations, a high electron density of the naturally occurring 2DEG in the areas 145, 146 surrounding the gate structure 170 cause a low source and/or drain parasitic resistance of the semiconductor device 100. Such a low parasitic resistance is improved, i.e., increased, by the barrier layer 150 in accordance with some embodiments. In particular, the electron density of the 2DEG in the areas 145, 146 is reduced by the partial depletion effect provided by the barrier layer 150. As a result, the parasitic resistance of the semiconductor device 100 in the OFF state is increased and the OFF current of the semiconductor device 100 is reduced. The reduction of the OFF current increases the on-off ratio of the semiconductor device 100 which is an advantageous design consideration in various applications, especially power applications, in accordance with some embodiments.

In some embodiments, the on-off ratio of the semiconductor device 100 is further improved by partially removing the barrier layer 150 in a region surrounding the gate structure 170. As described herein, the electron density of the 2DEG is decreased in areas under the barrier layer 150. While the decreased electron density of the 2DEG is beneficial in reducing the OFF current, the decreased electron density of the 2DEG also reduces the ON current density which is a design concern in some situations. In some embodiments, the ON current density of the semiconductor device 100 is improved, i.e., increased, by partially removing the barrier layer 150 in the region surrounding the gate structure 170. For example, the barrier layer 150 is partially removed in one or both of the source-to-gate region 197 and the drain-to-gate region 198. In one or more embodiments, the barrier layer 150 is partially removed by forming at least one opening in at least one of the source-to-gate region 197 and the drain-to-gate region 198, as described herein with respect to FIGS. 4, 5A and 5B. The partially removed barrier layer 150 provides a lower partial depletion effect on the 2DEG in the source-to-gate region 197 and/or the drain-to-gate region 198 than when the barrier layer 150 in these regions is not partially removed. As a result, the electron density of the 2DEG in the source-to-gate region 197 and/or the drain-to-gate region 198 is not decreased as much as when the barrier layer 150 is not partially removed, resulting in a higher ON current and a corresponding higher on-off ratio. In at least one embodiment, the barrier layer 150 is not partially removed in the gate region 196. In at least one embodiment, the barrier layer 150 is partially removed in at least one of the source region 192 and the drain region 194. In at least one embodiment, the barrier layer 150 is not partially removed in the source region 192 and the drain region 194 to provide good ohmic contacts between the source electrode 182 and the drain electrode 184 with the underlying structure.

Figure 2:
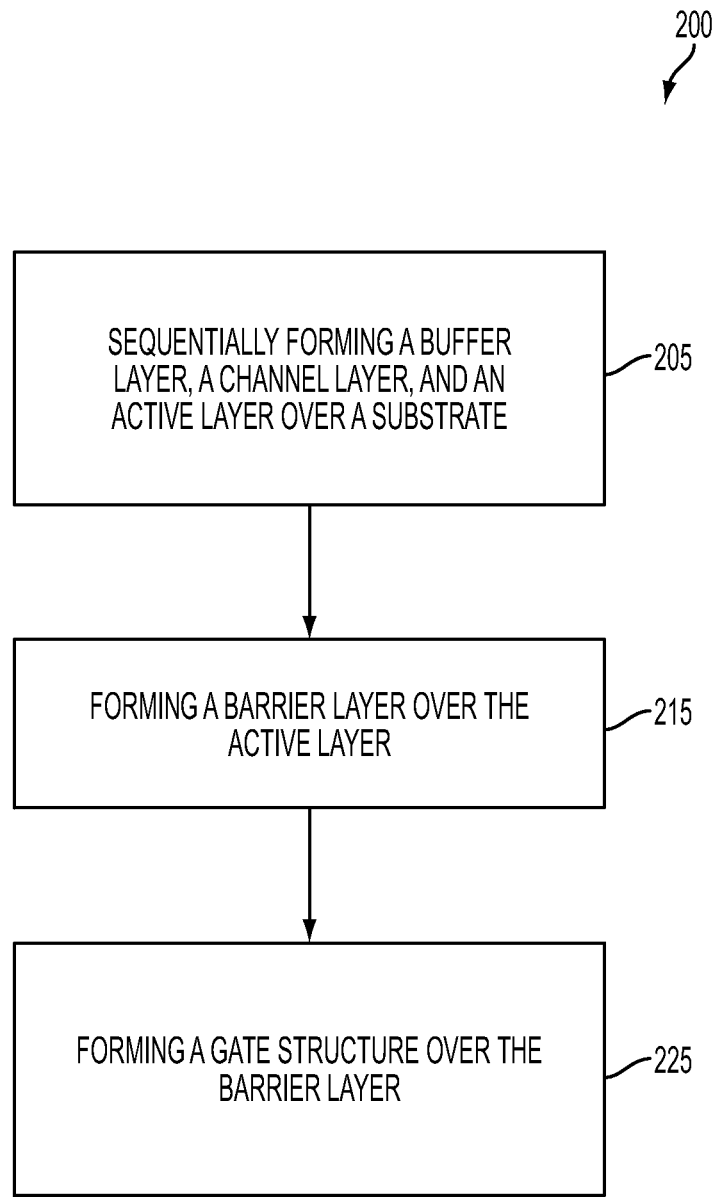
FIG. 2 is a flow chart of a method of manufacturing a semiconductor device in accordance with some embodiments.

FIG. 2 is a flow chart of a method 200 of manufacturing a semiconductor device in accordance with some embodiments, and FIGS. 3A-3E are schematic cross-sectional views of the semiconductor device at various stages during manufacture in accordance with some embodiments.

Figure 3A:
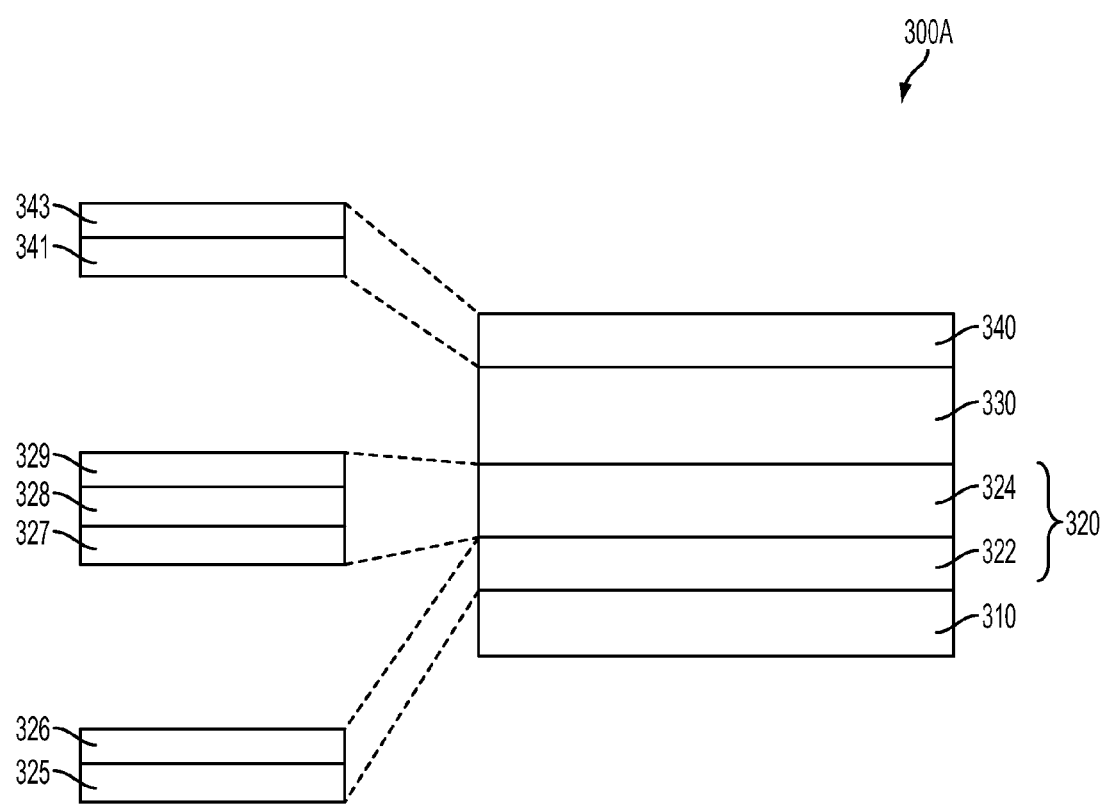

At operation 205 in FIG. 2, a buffer layer, a channel layer, and an active layer are sequentially formed over a substrate. For example, as shown in FIG. 3A, a substrate 310 is provided, and a buffer layer 320, a channel layer 330, and an active layer 340 are sequentially formed over the substrate 310, resulting in a structure 300A. In some embodiments, the substrate 310, the buffer layer 320, the channel layer 330 and the active layer 340 correspond to the substrate 110, the buffer layer 120, the channel layer 130 and the active layer 140 described with respect to FIG. 1.

As shown in FIG. 3A, the buffer layer 320 includes a nucleation layer 322 over the substrate 310. In some embodiments, the nucleation layer 322 corresponds to the nucleation layer 122 described with respect to FIG. 1. In at least one embodiment, the substrate 310 includes an Si(111) substrate. In some embodiments, the nucleation layer 322 comprises AlN. In some embodiments, the nucleation layer 322 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the nucleation layer 322 includes a lower AlN layer 325 and an upper AlN layer 326. In at least one embodiment, the lower AlN layer 325 is formed at a lower temperature than the upper AlN layer 326, and the lower AlN layer 325 is referred to as a low temperature (LT) AlN layer whereas the upper AlN layer 326 is referred to as a high temperature (HT) AlN layer. For example, the lower AlN layer 325 is formed, e.g., grown, at a temperature of 900 to 1000° C. to a thickness of 20 to 80 nm, and the upper AlN layer 326 is formed, e.g., grown, at a higher temperature of 1000 to 1300° C. to a thickness of 50 to 200 nm. In some embodiments, the nucleation layer 322 comprises a material other than AlN. In some embodiments, the nucleation layer 322 and the operation for forming the nucleation layer 322 are omitted.

The buffer layer 320 includes a transition layer 324 over the nucleation layer 322, or over the substrate 310 in at least one embodiment where the nucleation layer 322 is not formed. In some embodiments, the transition layer 324 corresponds to the transition layer 124 described with respect to FIG. 1. In some embodiments, the transition layer 324 is a graded aluminum-gallium nitride $Al_xGa_{(1-x)}N$ layer. In some embodiments, the graded aluminum gallium nitride layer has two or more of aluminum-gallium nitride layers each having a different ratio x decreased from the bottom to the top. In some embodiments, each of the two or more of aluminum-gallium nitride layers is formed by an epitaxial growth process, such as an MOCVD process, using aluminum-containing precursor, gallium-containing precursor, and nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In at least one embodiment, the transition layer 324 includes a bottom AlGaN layer 327, a middle AlGaN layer 328 and a top AlGaN layer 329. The bottom AlGaN layer 327 has the aluminum content ratio x of 0.7 to 0.9 and is formed, e.g., grown, at a temperature of 1000 to 1200° C. to a thickness of 50 to 200 nm. The middle AlGaN layer 328 has the aluminum content ratio x of 0.4 to 0.6 and is formed, e.g., grown, at a temperature of 1000 to 1200° C. to a thickness of 150 to 250 nm. The top AlGaN layer 329 has the aluminum content ratio x of 0.15 to 0.3 and is formed, e.g., grown, at a temperature of 1000 to 1200° C. to a thickness of 350 to 650 nm. Other numbers of AlGaN layers and/or aluminum content ratios in individual AlGaN layers are within the scope of various embodiments. In some embodiments, the graded aluminum gallium nitride layer has a continuous gradient of the ratio x gradually decreased from the bottom to the top and is formed by an MOCVD process. In some embodiments, the transition layer 324 and the operation for forming the transition layer 324 are omitted.

The channel layer 330 includes one or more Group III-V compound layers over substrate 310, the nucleation layer 322, and/or the transition layer 324. One or more of the Group III-V compound layers is doped in at least one embodiment. For example, the channel layer 330 in at least one embodiment includes C-doped GaN. In some embodiments, the channel layer 330 is formed, e.g., grown, by an epitaxial growth process, such as an MOCVD process or an MBE process. In at least one embodiment, the MOCVD process is performed using gallium-containing precursor and nitrogen-containing precursor, at a temperature of 1000 to 1200° C. to grow the channel layer 330 to a thickness of 500-5000 nm.

The active layer 340 is formed over the channel layer 330. In some embodiments, the active layer 340 includes AlGaN or a combination thereof. In some embodiments, the active layer 340 is formed by an epitaxial growth process, such as an MOCVD process, using aluminum-containing precursor, gallium-containing precursor, and nitrogen-containing precursor. In at least one embodiment, the active layer 340 includes a lower AlN layer 341 and an upper $Al_yGa_{(1-y)}N$ layer 342. The lower AlN layer 341 is formed, e.g., grown, at a temperature of 1000 to 1200° C. to a thickness of 0.5 to 1.5 nm. The upper $Al_yGa_{(1-y)}N$ layer 342 has the aluminum content ratio y of 0.1 to 0.3 (i.e., 10 to 30%) and is formed, e.g., grown, at a temperature of 1000 to 1200° C. to a thickness of 10 to 30 nm.

Figure 3C:
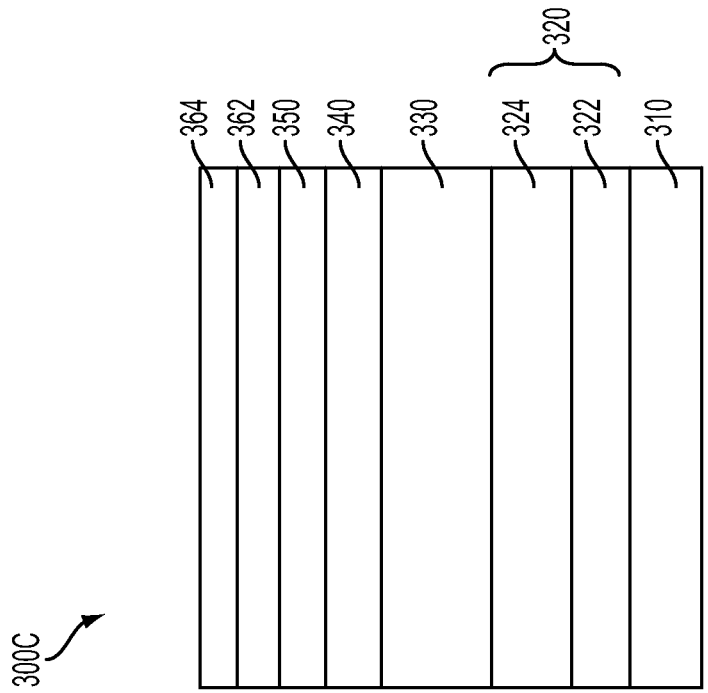
Figure 3B:
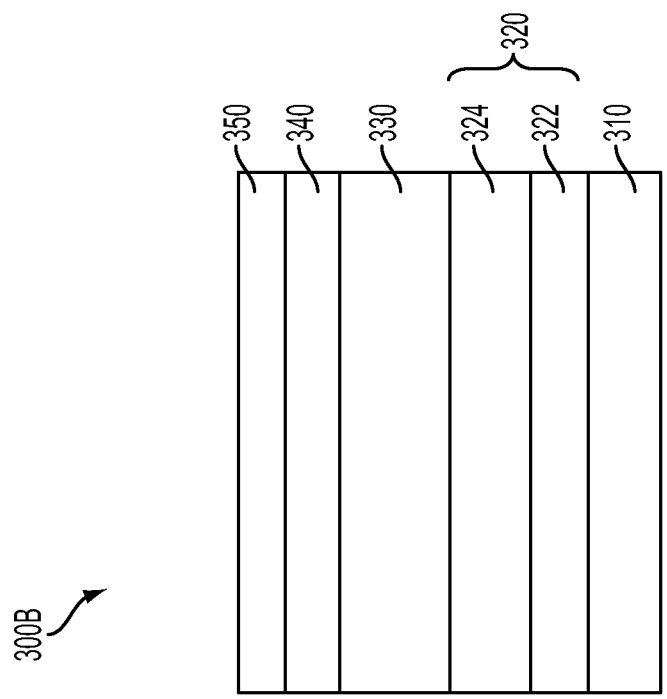

At operation 215 in FIG. 2, a barrier layer is formed over the active layer. For example, as shown in FIG. 3B, a barrier layer 350 is formed over the active layer 340 of the structure 300A, resulting in a structure 300B. In some embodiments, the barrier layer 350 corresponds to the barrier layer 150 described with respect to FIG. 1. In some embodiments, the barrier layer 350 includes a Group III-V compound layer. The Group III-V compound layer is undoped, or unintentionally doped, in at least one embodiment. In some embodiments, the barrier layer 350 is formed, e.g., grown, by an epitaxial growth process, such as an MOCVD process or an MBE process. In at least one embodiment, the MOCVD process is performed using gallium-containing precursor and nitrogen-containing precursor, at a temperature of 1000 to 1200° C. to grow the barrier layer 350 of i-GaN to a thickness of 2 to 5 nm.

At operation 225 in FIG. 2, a gate structure is formed over the barrier layer. For example, as shown in FIGS. 3C and 3D, a gate structure 370 (FIG. 3D) is formed over the barrier layer 350. In some embodiments, the gate structure 370 corresponds to the gate structure 170 described with respect to FIG. 1.

As shown in FIG. 3C, a p-doped layer 362 and an n-doped layer 364 are sequentially formed over the barrier layer 350 of the structure 300B, resulting in a structure 300C. The p-doped layer 362 is formed over the barrier layer 350. In at least one embodiment, the p-doped layer 362 includes a p-GaN layer. For example, the p-GaN layer includes Mg-doped GaN having the Mg concentration of 1E19 to 4E19 atoms/$cm^3$. The Mg-doped GaN layer is formed, e.g., grown, by an MOCVD process, to a thickness of about 75 nm. The n-doped layer 364 is formed over the n-doped layer 362. In at least one embodiment, the n-doped layer 364 includes an n-GaN layer. For example, the n-GaN layer includes Si-doped GaN having the Si concentration of 1E18 to 1E19 atoms/$cm^3$. The Si-doped GaN layer is formed, e.g., grown, by an MOCVD process, to a thickness of about 50 nm. In some embodiments, the n-doped layer 364 and the operation for forming the n-doped layer 364 are omitted.

As shown in FIG. 3D, the p-doped layer 362 and n-doped layer 364 outside a gate region 396 are removed from the structure 300C. The remaining p-doped layer 372 and n-doped layer 374 define gate structure 370, resulting in a structure 300D. In some embodiments, the p-doped layer 372 and the n-doped layer 374 correspond to the p-doped layer 172 and the n-doped layer 174 described with respect to FIG. 1.

In some embodiments, the process proceeds with the formation of a source electrode, a drain electrode and a gate electrode. For example, as shown in FIG. 3E, a source electrode 382, a drain electrode 384 and a gate electrode 386 are formed, resulting in a semiconductor device 300E. In some embodiments, the source electrode 382, the drain electrode 384 and the gate electrode 386 correspond to the source electrode 182, the drain electrode 184 and the gate electrode 186 described with respect to FIG. 1.

In some embodiments, a first passivation layer is formed over the structure 300D in a region not corresponding to a source region 392 and a drain region 394. Examples of materials for the first passivation layer include, but are not limited to, silicon nitride, silicon oxide, and silicon oxynitride. A first metal layer is formed over the first passivation layer. In some embodiments, the first metal layer includes a stack of metal layers, such as Ti/Al/Ti or Ti/Al/Ti/TiN. The first metal layer outside the source region 392 and the drain region 394 is etched away to form the source electrode 382 and the drain electrode 384. An annealing process is performed to form ohmic contacts under the source electrode 382 and the drain electrode 384, respectively. The ohmic contacts are formed by the metal diffused from the source electrode 382 and the drain electrode 384 into the barrier layer 350 and/or the active layer 340. For example, the annealing process is performed at 800 to 900° C. for 30 to 100 seconds. A second passivation layer is formed over the resulting structure. The first passivation layer and the second passivation layer are etched to form an opening exposing the underlying gate structure 370. A second metal layer is filled into the opening to form the gate electrode 386. The second metal layer outside the filled opening is etched away. In at least one embodiment, a gate dielectric layer is lined in the opening before the opening is filled with the second metal layer. Examples of materials for the gate dielectric layer include, but are not limited to, TiN and SiN. The second passivation layer over the source electrode 382 and the drain electrode 384 is removed to expose the source electrode 382 and the drain electrode 384. The remaining portions of the first and second passivation layers define a dielectric layer 380 isolating the gate electrode 386 from the source electrode 382 and the drain electrode 384.

Figure 4:
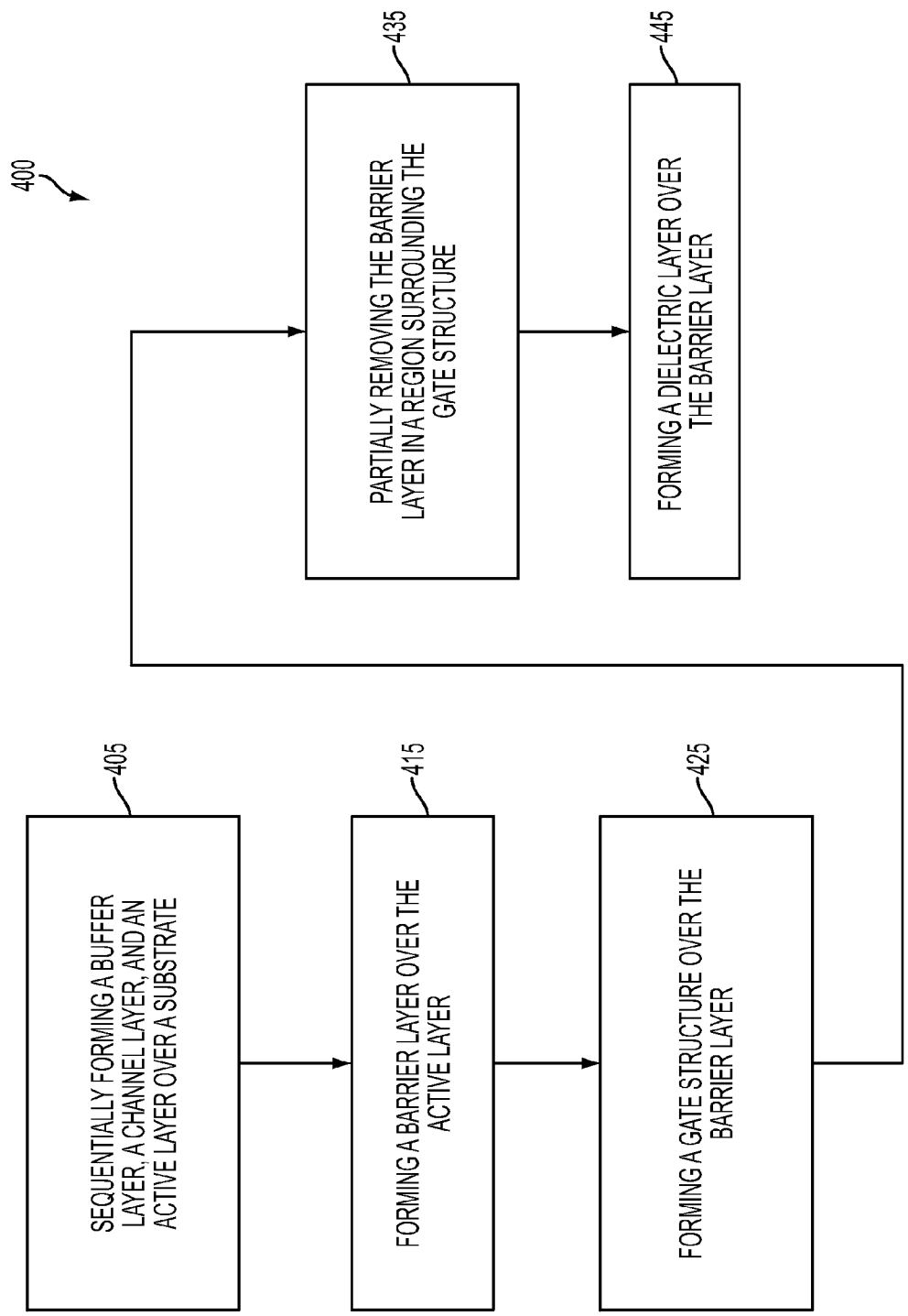
FIG. 4 is a flow chart of a method of manufacturing a semiconductor device in accordance with some embodiments.
Figure 5B:
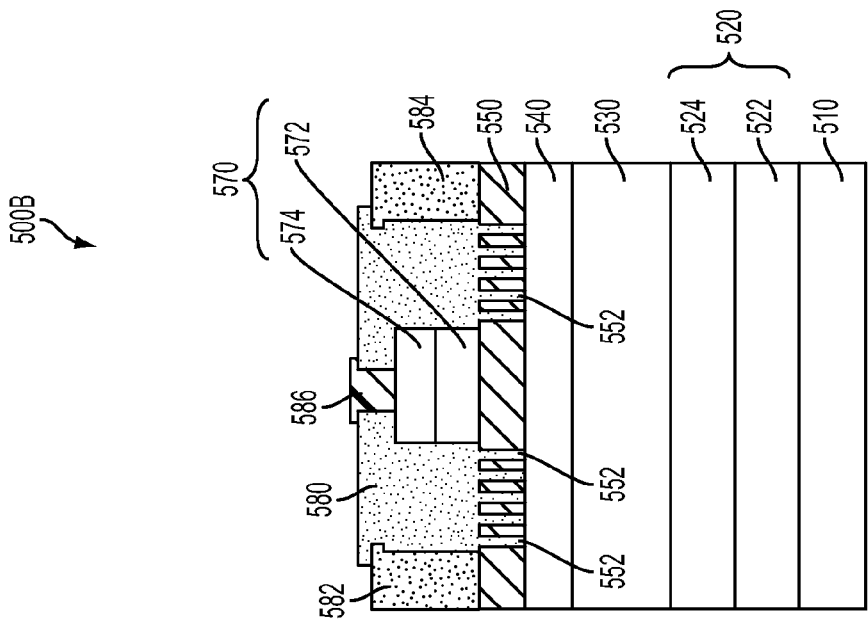
FIGS. 5A-5B are schematic cross-sectional views of a semiconductor device at various stages during manufacture in accordance with some embodiments.
Figure 5A:
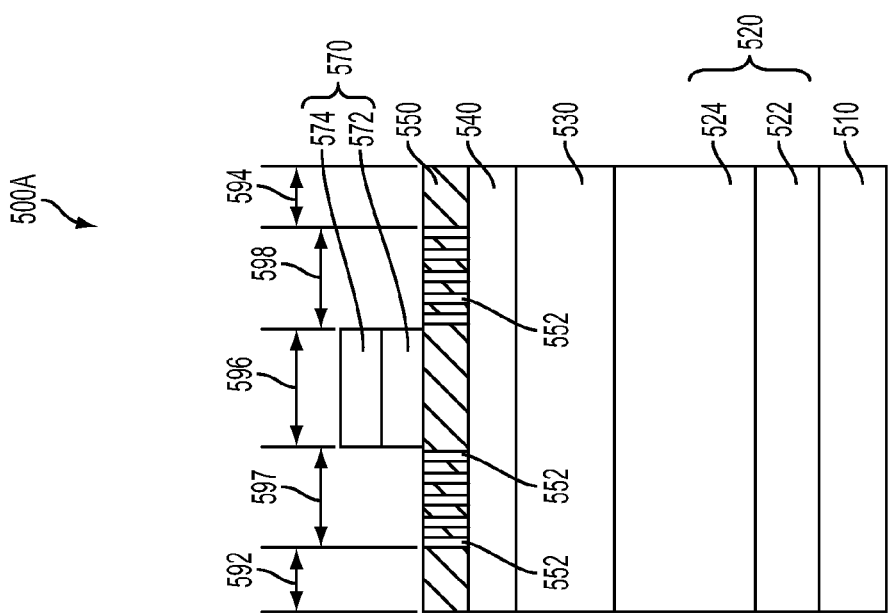

FIG. 4 is a flow chart of a method 400 of manufacturing a semiconductor device in accordance with some embodiments, and FIGS. 5A-5B are schematic cross-sectional views of the semiconductor device at various stages during manufacture in accordance with some embodiments.

At operation 405 in FIG. 4, a buffer layer, a channel layer, and an active layer are sequentially formed over a substrate. In some embodiments, operation 405 corresponds to operation 205 in the method 200 described with respect to FIGS. 2 and 3A, and results in a structure similar to the structure 300A in one or more embodiments.

At operation 415 in FIG. 4, a barrier layer is formed over the active layer. In some embodiments, operation 415 corresponds to operation 215 in the method 200 described with respect to FIGS. 2 and 3B, and results in a structure similar to the structure 300B in one or more embodiments.

At operation 425 in FIG. 4, a gate structure is formed over the barrier layer. In some embodiments, operation 425 corresponds to operation 225 in the method 200 described with respect to FIGS. 2 and 3C-3D, and results in a structure similar to the structure 300D in one or more embodiments.

At operation 435 in FIG. 4, a barrier layer is partially removed in a region surrounding a gate structure. For example, as shown in FIG. 5A, a barrier layer 550 is partially removed in a region surrounding a gate structure 570, resulting in a structure 500A. The structure 500A further comprises a substrate 510, a buffer layer 520, a channel layer 530, and an active layer 540. The buffer layer 520 includes a nucleation layer 522 and a transition layer 524. The gate structure 570 includes a p-doped layer 572 and an n-doped layer 574. In some embodiments, the substrate 510, the buffer layer 520, the channel layer 530, the active layer 540, the barrier layer 550, the gate structure 570, the nucleation layer 522, the transition layer 524, the p-doped layer 572 and the n-doped layer 574 correspond to the substrate 310, the buffer layer 320, the channel layer 330, the active layer 340, the barrier layer 350, the gate structure 370, the nucleation layer 322, the transition layer 324, the p-doped layer 372 and the n-doped layer 374 described with respect to FIG. 3D.

The barrier layer 550 is partially removed in a source-to-gate region 597 between a gate region 596 and a source region 592, and in a drain-to-gate region 598 between the gate region 596 and a drain region 594. In some embodiments, the source region 592, the drain region 594, the gate region 596, the source-to-gate region 597 and the drain-to-gate region 598 correspond to the source region 192, the drain region 194, the gate region 196, the source-to-gate region 197 and the drain-to-gate region 198 described with respect to FIG. 1. The barrier layer 550 is partially removed by forming, e.g., by etching, a plurality of openings 552 in each of the source-to-gate region 597 and drain-to-gate region 598. In at least one embodiment, a width of each opening 552 is 100 to 1000 nm, and an interval between adjacent openings 552 is 1000 nm. The barrier layer 550 is continuous in the source region 592, the drain region 594 and the gate region 596. The barrier layer 550 is discontinuous in the source-to-gate region 597 and the drain-to-gate region 598 by the openings 552. In one or more embodiments, the openings 552 are formed in the source region 592 and/or the drain region 594.

At operation 445 in FIG. 4, a dielectric layer is formed over the barrier layer. For example, as shown in FIG. 5B, a dielectric layer 580 is formed over the barrier layer 550 with the openings 552 therein. The dielectric layer 580 fills the openings 552.

In some embodiments, the process proceeds with the formation of a source electrode, a drain electrode and a gate electrode. For example, as shown in FIG. 5B, a source electrode 582, a drain electrode 584 and a gate electrode 586 are formed, resulting in a semiconductor device 500B. In some embodiments, the dielectric layer 580, the source electrode 582, the drain electrode 584 and the gate electrode 586 correspond to and are formed in the manner described with respect to the dielectric layer 380, the source electrode 382, the drain electrode 384 and the gate electrode 386 in FIG. 3E.

The above methods include example operations, but they are not necessarily performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a semiconductor device comprises a substrate, a channel layer over the substrate, an active layer over the channel layer, a gate structure over the active layer, and a barrier layer between the gate structure and the active layer. The active layer is configured to cause a two dimensional electron gas (2DEG) to be formed in the channel layer along an interface between the channel layer and the active layer. The gate structure is configured to deplete the 2DEG under the gate structure. The gate structure comprises a dopant. The barrier layer is configured to block diffusion of the dopant from the gate structure into the active layer.

According to some embodiments, a semiconductor device comprises a source region, a drain region, a gate region, a semiconductor substrate, a channel layer over the semiconductor substrate, an active layer over the channel layer, a barrier layer over the active layer, a gate structure over the barrier layer in the gate region, and a source electrode and a drain electrode in the source region and the drain region, respectively. The barrier layer is continuous in the gate region. The barrier layer is discontinuous between (i) the gate region and (ii) at least one of the source region or the drain region.

In a method of manufacturing a semiconductor device in accordance with some embodiments, a channel layer is formed over a substrate. An active layer is formed over the channel layer. A barrier layer is formed over the active layer. A gate structure including a dopant is formed over the barrier layer. The barrier layer defines a diffusion barrier to the dopant of the gate structure. The barrier layer is partially removed in a region surrounding the gate structure.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A semiconductor device, comprising:
a substrate;
a channel layer over the substrate;

an active layer over the channel layer, the active layer configured to cause a two dimensional electron gas (2DEG) to be formed in the channel layer along an interface between the channel layer and the active layer;

a gate structure over the active layer, the gate structure configured to deplete the 2DEG under the gate structure, the gate structure comprising a dopant; and a barrier layer between the gate structure and the active layer, the barrier layer configured to block diffusion of the dopant from the gate structure into the active layer.

2. The semiconductor device of claim 1, wherein the barrier layer is configured to further deplete the 2DEG under the gate structure and partially deplete the 2DEG in a region surrounding the gate structure.

3. The semiconductor device of claim 1, wherein
the semiconductor device comprises a source region, a drain region, and a gate region corresponding to the gate structure,
the barrier layer is continuous in the gate region, and
the barrier layer is discontinuous between (i) the gate region and (ii) at least one of the source region or the drain region.

4. The semiconductor device of claim 3, wherein, between (i) the gate region and (ii) the at least one of the source region or the drain region, the barrier layer includes at least one opening filled with a dielectric material.

5. The semiconductor device of claim 3, wherein the barrier layer is continuous in the at least one of the source region or the drain region.

6. The semiconductor device of claim 1, wherein the barrier layer comprises an undoped Group III-V compound.

7. The semiconductor device of claim 1, wherein the barrier layer has a higher lattice constant than a lattice constant of the active layer.

8. A semiconductor device, comprising:
a source region, a drain region, and a gate region;
a semiconductor substrate;
a channel layer over the semiconductor substrate;
an active layer over the channel layer;
a barrier layer over the active layer;
a gate structure over the barrier layer in the gate region; and
a source electrode and a drain electrode in the source region and the drain region, respectively;
wherein
the barrier layer is continuous in the gate region, and
the barrier layer is discontinuous between (i) the gate region and (ii) at least one of the source region or the drain region.

9. The semiconductor device of claim 8, wherein, between (i) the gate region and (ii) the at least one of the source region or the drain region, the barrier layer includes a plurality of openings.

10. The semiconductor device of claim 9, further comprising:
a dielectric layer over the barrier layer, the dielectric layer isolating the gate structure from the source electrode and the drain electrode;
wherein a dielectric material of the dielectric layer fills the openings in the barrier layer.

11. The semiconductor device of claim 8, wherein the barrier layer is continuous in the at least one of the source region or the drain region.

12. The semiconductor device of claim 8, wherein the barrier layer has a higher lattice constant than a lattice constant of the active layer.

13. The semiconductor device of claim 8, wherein the barrier layer has a thickness of 2 to 5 nm.

14. The semiconductor device of claim 8, wherein the barrier layer comprises an undoped Group III-V compound.

15. The semiconductor device of claim 14, wherein the Group III-V compound comprises at least one material selected from the group consisting of GaN, AlGaN, InGaN and InAlGaN.

16. The semiconductor device of claim 15, wherein the gate structure comprises
a p-doped layer over the barrier layer,
an n-doped layer over the p-doped layer, and
a gate electrode over the n-doped layer.

17. The semiconductor device of claim 16, wherein
the channel layer comprises GaN,
the active layer comprises AlGaN,
the n-doped layer comprises n-doped GaN, and
the p-doped layer comprises p-doped GaN.

18. The semiconductor device of claim 17, further comprising:
a buffer layer between the semiconductor substrate and the channel layer, the buffer layer comprising:
an AlN layer over the semiconductor substrate; and
a plurality of AlGaN layers over the AlN layer and under the channel layer, the plurality of AlGaN layers having an Al concentration reducing toward the channel layer.

19. A semiconductor device, comprising:
a substrate;
a channel layer over the substrate;
an active layer over the channel layer, the active layer configured to cause a two dimensional electron gas (2DEG) to be formed in the channel layer along an interface between the channel layer and the active layer;
a gate structure over the active layer, the gate structure configured to deplete the 2DEG under the gate structure; and
a barrier layer between the gate structure and the active layer, the barrier layer having a higher lattice constant than a lattice constant of the active layer.

20. The semiconductor device of claim 19, wherein
the active layer comprises $Al_y Ga_{(1-y)} N$ ($0 < y \leq 1$), and
the barrier layer comprises a Group III-V compound.

* * * * *